United States Patent [19]
Remsburg

[11] Patent Number: 5,917,157
[45] Date of Patent: Jun. 29, 1999

[54] MULTILAYER WIRING BOARD LAMINATE WITH ENHANCED THERMAL DISSIPATION TO DIELECTRIC SUBSTRATE LAMINATE

[76] Inventor: Ralph Remsburg, 2662 Beacon Hill Dr. #308, Auburn Hills, Mich. 48326

[21] Appl. No.: 08/939,946

[22] Filed: Sep. 29, 1997

Related U.S. Application Data

[63] Continuation of application No. 08/354,509, Dec. 12, 1994, abandoned.

[51] Int. Cl.$^6$ ...................................................... H05K 1/03
[52] U.S. Cl. .......................................... 174/252; 174/255
[58] Field of Search .................................. 174/252, 16.3, 174/255, 250, 262, 254; 361/720, 713, 704, 719, 699, 689, 784; 257/712, 713, 700; 428/647, 601, 622, 626, 629

[56] References Cited

U.S. PATENT DOCUMENTS

| | | | |
|---|---|---|---|
| 4,882,454 | 11/1989 | Peterson et al. | 174/252 |
| 4,963,697 | 10/1990 | Peterson et al. | 174/252 |
| 5,258,887 | 11/1993 | Fortune | 361/720 |
| 5,321,210 | 6/1994 | Kimbara et al. | 174/256 |
| 5,347,091 | 9/1994 | Schroeder | 174/262 |

*Primary Examiner*—Kristine Kincaid
*Assistant Examiner*—William Silverio
*Attorney, Agent, or Firm*—Klima & Pezzlo, P.C.

[57] ABSTRACT

A strongly adherent laminate with enhanced thermal conductivity and high dielectric strength. The preferred embodiment includes an aluminum-surfaced substrate, a copper layer adjacent the aluminum oxide layer, and optionally, a tin/silver layer adjacent the copper deposition layer, forming a base substrate laminate for mounting a multilayer wiring board laminate to has been discovered. Another embodiment includes a metallic-surfaced substrate, an adjacent vapor-deposited dielectric layer, a metallic conductor layer adjacent the dielectric layer, and optionally, a solder layer adjacent the metallic conductor layer. Surprisingly, such construction has been demonstrated to have a self-healing dielectric whereby dielectric breakdown strength is maintained in repeated tests. Such laminates will find utility in the electronics industry in the fabrication of printed circuit boards and afford a combination of high adhesion, thermal conductivity, and dielectric strength heretofore unknown in the industry.

9 Claims, 9 Drawing Sheets

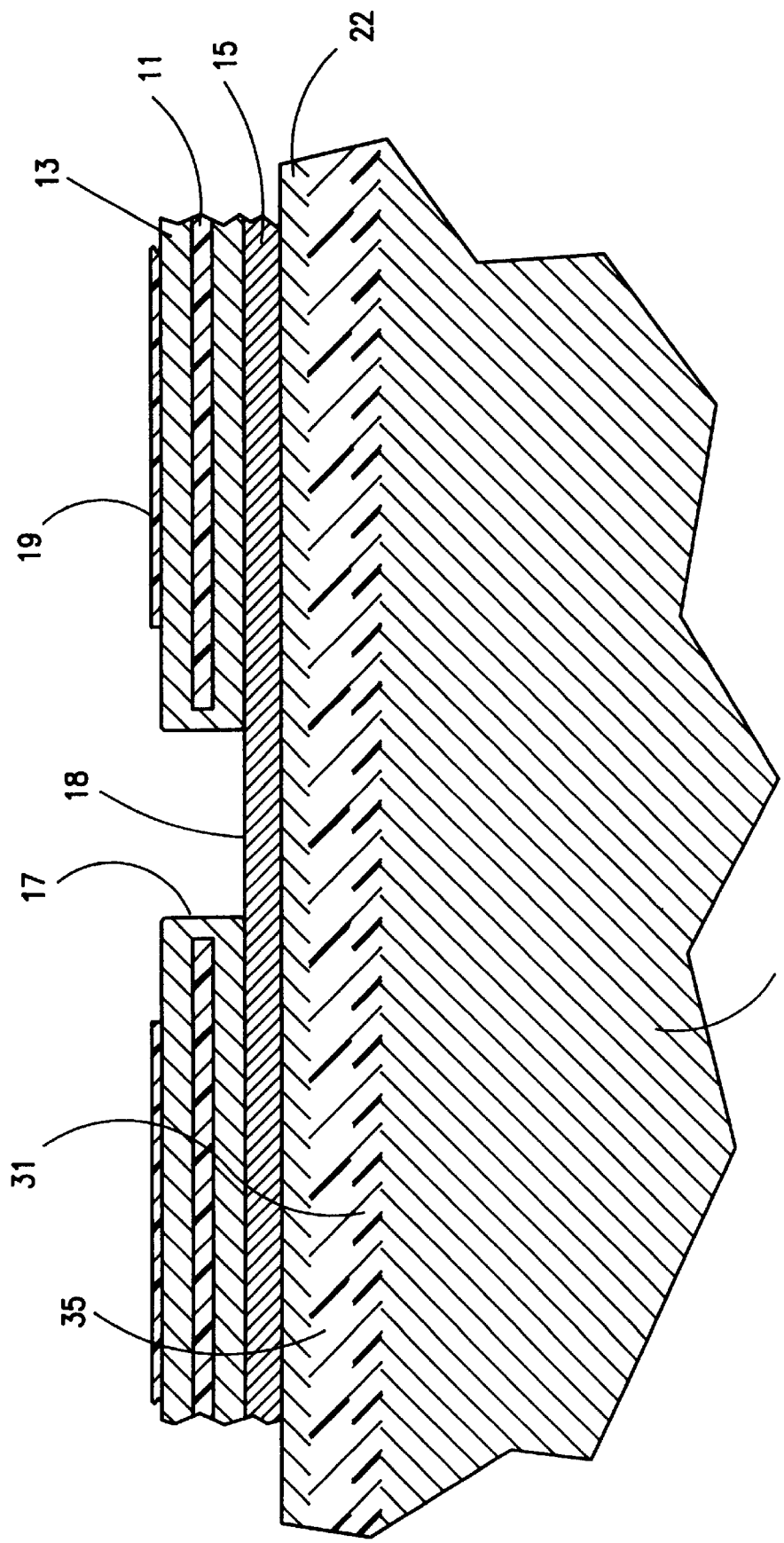

MULTILAYER WIRING BOARD LAMINATE WITH ENHANCED THERMAL DISSIPATION TO DIELECTRIC SUBSTRATE LAMINATE

This application is a continuation of prior U.S. application Ser. No. 08/354,509, filed Dec. 12, 1994, now abandoned.

CROSS-REFERENCE TO RELATED MATERIAL

Some of the subject matter taught herein was originally disclosed and claimed in U.S. patent application Ser. No. 07/674,820, now abandoned, filed Mar. 22, 1991 incorporated herein by reference.

BACKGROUND

1. Field of Invention

The present invention relates to printed wiring board laminates and more particularly to substrate laminates suitable for use in the electronics industry. Specifically, the present invention relates to a method of bonding a multilayer wiring board to a dielectric-surfaced substrate, and the method of processing the substrate which results in improved dielectric strength, thermal conductivity, and bond strength between the multilayer circuit board and the substrate.

2. Description of Prior Art

Power processing circuits are typically characterized by high voltage, high current, and high power dissipation requirements. The trends toward increased power processing densities further increase the demands on circuit fabrication technology. Printed wiring boards represent a relatively low-cost method of fabrication. In a typical single layer board, a copper layer is laminated or electroplated to an organic board material. The organic board material prohibits high thermal dissipation due to its low thermal conductivity. Thermal resistance is usually specified for the area of a TO-220 semiconductor package. The TO-220 package represents a 0.25 in.$^2$ heat transfer area. Thermal resistance through this type of board is found to be around 11° C/W, for a section 0.062 inch thick. Those skilled in the art have been successful in processing thinner sections using flexible polyimide. Typical resistance for a TO-220 package using a 2-mil thick polyimide layer is approximately 2.63° C/W.

Insulated Metal Substrates (IMS) with a tri-layer construction have overcome some of the heat dissipation concerns. In this method of construction, the copper circuit layer is laminated to a metal substrate having high thermal conductivity. Metal substrates constructed of aluminum or copper are prevalent in the art. To provide the desired electrical insulation between the copper circuit layer and the metallic substrate, a dielectric insulator layer such as a thermally conductive epoxy or acrylic adhesive may be used. Circuit boards of this type, using a proprietary adhesive insulation layer can provide a thermal resistance of 0.31° C/W when a 0.062 inch thick section is used (0.005 inch adhesive, 0.057 inch aluminum).

Circuit boards using dielectric ceramics often provide a better solution to the problem of heat dissipation, although at a much higher cost. It is widely known that copper is not readily deposited to an aluminum oxide layer with a bond strength that is acceptably high enough for use as a circuit board assembly. Because of this, there are four distinct types of methods for attaching copper circuit traces to a ceramic substrate. In the Thick Film method, a copper metal paste is applied to a fired ceramic substrate and re-fired to result in a copper circuit bonded to a dielectric ceramic. In the Thin Film method, the metal circuitry layer may be plated, sputtered, or vapor-deposited onto the pre-fired ceramic substrate. The Cofired method is similar to the Thick Film method but the metal paste and the ceramic slurry are fired simultaneously. The Direct Bond Copper (DBC) method is similar to the Cofired method, wherein an oxidized copper circuit pattern is placed onto the ceramic. The assembly is fired until the copper oxide reflows into the ceramic oxide. The most popular types of ceramics used are aluminum oxide ($Al_2O_3$), beryllium oxide (BeO), and aluminum nitride (AlN). Because of the material property limitations of ceramics, i.e., brittleness, lack of machinability, etc., the ceramic is usually mounted to a metal substrate. The method of mounting is usually an adhesive, which re-introduces the problems associated with adhesives noted previously.

All of these types of basic power circuitry boards; organic epoxy, standard IMS, and ceramic substrate, suffer from the limitation that only one layer of copper circuitry can be used. Advances to these basic processes have allowed circuitry to be built on top of the base circuit layer, separated by a dielectric layer. Depending on the number of circuit layers, these multilayer circuit assemblies may allow much higher levels of circuit density. Still, each of these methods requires the use of an adhesive to attach the circuit to a substrate having the desired mechanical properties. In applications requiring enhanced thermal conductivity, the aforementioned united multilayer board structure is bonded by hot pressing to a heat sink structure using an adhesive. The desired adhesive must display good thermal conductivity and a high dielectric strength. The property of high dielectric strength is necessary to prevent the establishment of an electrically conductive path between the multilayer board structure and the heat sink structure.

Even though the as-manufactured laminate structure may exhibit a good tradeoff between thermal conductivity and dielectric strength, these properties may not be maintained during actual use. During thermal cycling in high humidity environments, the coefficients of thermal expansion of the various materials may cause a pumping action to occur. This pumping action can allow the introduction of water vapor into the adhesive. When the water vapor condenses and freezes, thus expanding, cracks may occur in the adhesive. As thermal cycling continues, these crack can increase in size and cause dielectric breakdown and a loss of bond strength leading to delamination, which in turn results in higher thermal resistance. In many cases, the introduction of water vapor will cause an electrogalvanic cell to become active. The corrosion cell is maintained by the water vapor in the adhesive, and the proximity of the aluminum substrate to the copper conductor layer and the voltage difference between the active copper conductor circuitry and the ground potential of the aluminum substrate.

Because of the well known limitations and compromises in thermal conductivity and dielectric strength of adhesives, those knowledgeable in the art may add a very thin (<1-mil) dielectric polymer layer suspended within the interstitial adhesive layer, midway between the multilayer wiring board copper layer and the aluminum substrate. In this manner, the adhesive may be optimized for high thermal conductivity without regard for the necessary high dielectric strength—dielectric strength being supplied by the dielectric polymer layer. These methods, while largely eliminating electrogalvanic corrosion, still result in high thermal resistance because of the low thermal conductivity inherent in dielectric polymers.

Multilayer circuit boards may use several layers of epoxy laminate, polyimide, or other dielectric layers to join the intermediate layers of copper circuitry together. More recently multilayer wiring boards of a different type have been developed to meet the demand for multilayer wiring boards which can be made higher in wiring density and can be used in large computers. A multilayer wiring board of the new type may use polyimide resin as the interlaminar insulating material to support a plurality of wiring layers on a ceramic substrate. This type of multi-layer wiring board is produced by alternately repeating a process for forming a polyimide insulating layer and another process for forming a wiring layer. The former process includes applying a polyimide varnish to the substrate or a precedingly formed wiring layer, drying the varnish, forming via holes in the polyimide layer and then curing the polyimide. The latter process includes forming a wiring pattern by photolithography and then creating a wiring layer by vacuum evaporation or plating. Kimbara et al teaches a number of such techniques in U.S. Pat. No. 5,321,210.

However, as previously explained, thick ceramic substrates do not have good thermal conductivity and are known to be quite brittle, precluding their use as structural members. In applications where the use thick ceramics is mandated, these ceramics must be bonded to a heat sink structure material such as aluminum, with an adhesive displaying good thermal conductivity. As in the aforementioned fiber prepreg and flexible laminates, current technology adhesives lack the combination of good thermal conductivity and high dielectric strength that is necessary for high power devices. In addition, the ceramic substrates as a class are too expensive to use in economical commercial applications.

To transfer the heat from power components mounted on the top side of a multilayer circuit board to the bottom layer, copper-plated through-holes are used. The use of twenty, 0.028 inch diameter through-holes plated with 2-mils of copper can reduce the thermal resistance of an epoxy board from the aforementioned 11° C/W down to 0.56° C/W. To dissipate this heat, the multilayer board will still require attachment to a metallic substrate. Using the aforementioned proprietary adhesive, the thermal resistance becomes about 0.9° C/W for a rigid epoxy resin board. Where then a thin (2-mil) section of polyimide is used instead of the epoxy, the thermal resistance can be reduced to 0.38° C/W. Unfortunately, the largest thermal resistance, about 70% of the 0.38° C/W, is within the adhesive layer, at 0.26° C/W.

Clearly, in order to dissipate the heat from small, high power (>10W) components, a better method of attaching the multilayer circuit to a metallic substrate is required.

Prior art techniques whereby the lower copper conductor of the multilayer wiring board structure is bonded to the aluminum substrate without a thermally insulative adhesive layer have been largely unsuccessful. Because one of the most widely used dielectrics, aluminum oxide ($Al_2O_3$), forms readily on the surface of aluminum when exposed to oxygen, a number of techniques are known in the art for anodizing aluminum with this dielectric coating. Most of these techniques specifically pertain to producing lithographic grade aluminum printing plates. Most of these direct bonding techniques of the copper layer to the aluminum oxide have failed dielectrically and thermally because the oxide layer is porous. Depositing a copper conductor onto the aluminum oxide generally causes the copper atoms to diffuse into the aluminum oxide pores and diminish the dielectric strength of the aluminum oxide layer that is essential to the electronic circuit. Producing a thicker oxide layer on the aluminum substrate causes the oxide layer to become more porous. Therefore, the increase in dielectric strength does not increase linearly with increasing oxide layer thickness.

Prior art techniques whereby the thickness and porosity of the aluminum oxide layer are minimized by special baths and sealed pores, have lead to poor adhesion between the oxide layer and the copper conductor. This is thought to be due to the insufficient penetration and diffusion of the copper atoms into the sealed pores. This lack of molecular-level metal penetration into the aluminum oxide pores is thought to be due to vapor droplet size in vapor deposition and sputtering processes, and electrolyte wettability in electroplating operations.

Several techniques are known to those skilled in the art of producing tighter pores in aluminum oxide coatings on aluminum substrates. In these techniques, the tighter pores lead to a perception of higher dielectric strength only because the wettability of the electrolyte bath cannot penetrate the small pores of the aluminum oxide. Specifically, the values cited as dielectric strength across a somewhat porous material in the prior art cannot be considered accurate unless the method of testing and the current sensitivity are detailed. For example, many dielectric strength tests specify placing two needle-like probes against opposite faces of a dielectric material and increasing the voltage until current flows, thereby indicating a breakdown in dielectric properties. If a somewhat porous material is tested so that separate bodies of a low surface tension fluid are in contact with the aforementioned opposite faces of the dielectric material, the dielectric strength would be lower than in the previous test because the low surface tension fluid, having a high wetting action, would penetrate the pores to some degree and in effect, decrease the distance between the two probes. In another example, if each surface of the aforementioned somewhat porous dielectric material is metallically plated in an atom-by-atom process, the metal surface would penetrate much further into the dielectric material. Tested in this manner, the dielectric strength of this same material would be very much lower than in the needle-like probe test. In any of aforementioned test methods, instruments that register a dielectric breakdown strength of 50 $\mu A$ will indicate a lower dielectric strength than an identical instrument set at a monitoring level of 5 mA.

Dielectric strength testing is known in the art as a destructive test, whereby items that are tested in this manner may not be retested because of the destructive nature of the voltage and current path. Depending on the material used, when the voltage is increased to a point to overcome the resistance properties of the material, a current will flow along the path of least resistance. Repeated testing will yield a lower dielectric strength rating because a conductive path has now been established within the dielectric material, usually due to carbon tracking. One material which does not have this drawback is cellulose triacetate, which displays an instantaneous self-healing property. This material is also known to have very poor thermal conductivity which precludes its use in the field of thermally conductive circuit board laminates.

U.S. Pat. No. 4,481,083 to Ball et al teaches a method for producing an aluminum oxide layer on an aluminum film with a dielectric strength of up to 760 VDC for use in electrolytic capacitors. The method of dielectric strength testing is not specified, nor is there any mention of thermal conductivity, or bond strength to a copper deposition layer.

U.S. Pat. No. 4,894,126, and U.S. Pat. No. 4,898,651, both to Mahmoud describe a method for producing an aluminum oxide layer on an aluminum substrate for use as a substrate in an electronic circuit. The method of dielectric strength testing is not specified, nor is there any indication of thermal conductivity, or bond strength to a copper deposition layer.

It is widely known that most materials are not readily applied to an aluminum oxide layer with a sufficient bond strength, and there are techniques for increasing the adhesion strength.

U.S. Pat. No. 5,277,788 to Nitowski et al describes an aluminum substrate which has been twice-anodized and exposed to a third process which provides a leaving group of molecules to be reacted with an appropriate organic coating. This leaving group of molecules, while providing high adhesion, causes an unacceptably large decrease in thermal conductivity.

While the difficulty of bonding copper to aluminum oxide is a detriment when producing ceramic substrate electronic circuit boards, it is an advantage when producing the copper circuit traces that will be adhesively bonded to a rigid or flexible non-ceramic substrate. In fact, several techniques are known in the art for producing an easily peelable copper layer on aluminum oxide.

U.S. Pat. No. 4,431,710 to Lifshin et al describes a method for utilizing an oxidized aluminum carrier for the deposition and handling of a thin copper layer. Dielectric strength and thermal conductivity are not noted and are assumed to be unacceptable for use in aluminum substrate to multilayer wiring board laminates.

U.S. Pat. No. 5,322,975 to Nagy et al teaches the use of an aluminum oxide layer at least 1100 Angstroms thick to allow easier peeling of an electrodeposited copper layer. Dielectric strength and thermal conductivity are not noted and are assumed to be unacceptable for use in aluminum substrate to multilayer wiring board laminates.

None of the known prior art or literature describes a method for producing a multilayer circuit board which may be attached to a metallic substrate with the requirements of high thermal conductivity, high bond strength, and high dielectric strength. In fact, because of the nature of electron movement through an atomic lattice structure, the requirements of high dielectric strength and high thermal conductivity are most often in conflict.

OBJECTS AND ADVANTAGES

The present invention provides a superior method of attachment of a multilayer circuit board onto a metallic substrate. The attachment method and processes used to prepare the metallic substrate offer improved heat dissipation, improved dielectric strength, and improved bond strength of the circuit board to the metallic substrate. In addition, the processes used in the formation of the subject invention provides a surprising self-healing dielectric property.

Therefore, in accordance with an aspect of the present invention, several primary objects and advantages of the present invention are:

(a) to provide a new and improved method of bonding the bottom conductor layer of a circuit board to a structural substrate;

(b) to provide a new and improved method of bonding two identical circuits together by use of a fluxed solder;

(c) to provide a method of forming an oxide layer, on a metallic-surfaced substrate with enhanced thermal, dielectric, and mechanical adhesion properties;

(d) to provide a low-cost method of providing both electrically conductive and electrically nonconductive contact areas and attachment of a circuit board to a metallic-surfaced substrate.

(e) to provide a multilayer wiring board/metallic-surfaced substrate assembly that is not predisposed to electro-galvanic corrosion action caused by moisture absorption.

(f) to provide an anodizing process that results in a true higher dielectric strength.

(g) to provide a laminate such that repeated application of voltages exceeding the dielectric breakdown strength does not result in a lowering of subsequent dielectric strength properties.

These and other objects and advantages of the present invention will no doubt become obvious to those of ordinary skill in the art after having read the following detailed description of the preferred embodiment, which is illustrated in the various drawing figures.

SUMMARY OF THE INVENTION

In accordance with the present invention, it has been discovered that an aluminum oxide layer which is deposited on the aluminum substrate in two steps greatly reduces the diffusion of copper atoms into the first step (primary) aluminum oxide layer but promotes copper diffusion into the second step (secondary) layer of aluminum oxide resulting in a multilayer printed wiring board laminate structure that has a strongly adherent copper layer-to-aluminum substrate providing low thermal resistance and high dielectric strength. Anodizing in two separate steps breaks the continuous pore path found in methods that apply only thicker anodic coatings to increase dielectric strength. Additionally, the use of an optional solder layer affords excellent bonding between the copper layer of the aluminum substrate laminate and the lower conductor layer of the printed wiring board laminate resulting in a multilayer printed wiring assembly displaying excellent thermal conductivity, dielectric strength, and internal adhesion. Preferably the copper and solder layers are applied to specific areas of the substrate. Alternately such layers may be deposited and precisely etched away to allow Z-axis-only conductivity between closely spaced conductor paths of the bottom copper conductor layer of the printed wiring board laminate and identically patterned copper or solder conductors of the aluminum substrate laminate.

The aluminum laminate of the multilayer printed wiring board laminate disclosed by the present invention is comprised of an aluminum substrate, a primary layer of aluminum oxide, a secondary layer of aluminum oxide, and a layer of copper deposited on the aluminum oxide secondary layer. Subsequently, the copper layer may be masked and chemically etched to produce an electrically conductive patterned circuit of copper, and a layer of solder deposited on the etched copper foil pattern. The side of the aluminum laminate that has the layer of solder deposited thereon may then be affixed to a polymeric substrate, the polymeric substrate having an identical pattern of copper as the aluminum laminate, allowing the solder layer to enact a copper-to-copper solder bond.

In another example of the present invention, the two-step anodizing process may be replaced with chemical vapor deposition (CVD) of the aluminum oxide on to the substrate. Other subsequent steps in the process remain the same.

Further, in accordance with the present invention, a process resulting in an aluminum substrate-primary aluminum oxide-secondary aluminum oxide-copper-tin/silver laminate which overcomes some major disadvantages of aluminum-copper laminates currently used in the production of printed circuit boards has been discovered. In particular, the laminate disclosed in the present invention comprising aluminum substrate-aluminum oxide-copper layers provides improved thermal conductivity, improved dielectric strength, and improved adhesion properties.

It has also been observed that the dielectric breakdown strength produced by the present invention provides a surprising self-healing property.

BRIEF DESCRIPTION OF THE DRAWINGS

The invention will be further described in connection with the attached drawing figures illustrating preferred embodiments of the invention including elements and arrangements of elements. It is intended that the drawings included as part of this specification be illustrative of the preferred embodiments of the present invention and should in no way be considered a limitation on the scope of the invention. In the drawings, closely related figures have the same number but different alphabetic suffixes.

FIG. 4 is a cross-section of a multilayer laminate according to the present invention showing the various layers of the laminate comprising an aluminum substrate-aluminum oxide primary layer-aluminum oxide secondary layer-copper conductor deposition layer-solder layer-lower copper conductor layer-dielectric film layer-upper copper conductor layer laminate structure in accordance with the present invention.

REFERENCE NUMERALS USED IN DRAWINGS

Figure 1:
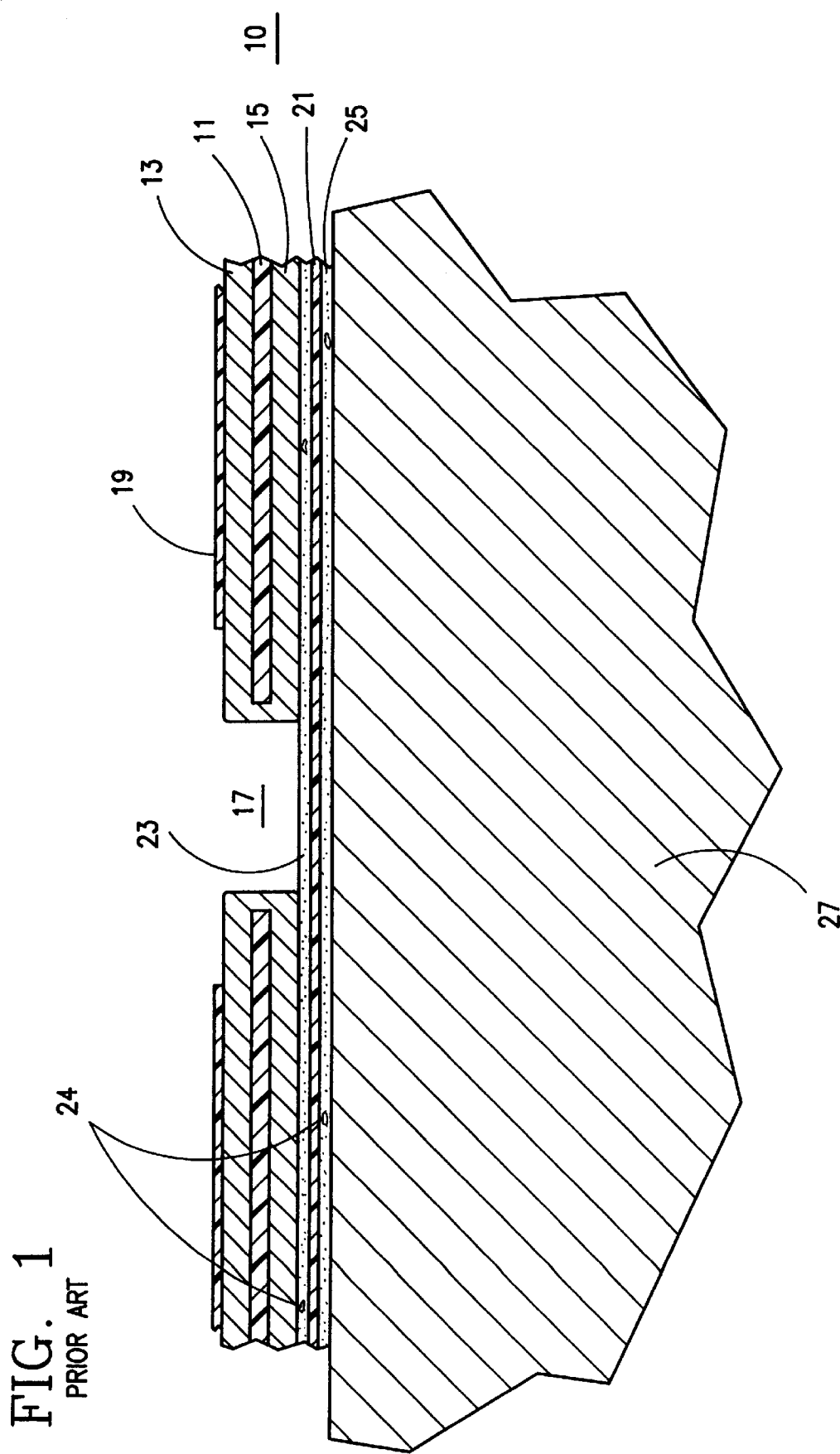
FIG. 1 is a cross-section of a prior art, multilayer printed wiring board showing a thermal via and the various layers of the laminate comprising a substrate-adhesive-dielectric-adhesive-conductor-dielectric-conductor laminate.

| 10 | Multilayer Wiring Board |
| 11 | Dielectric Base Material |
| 12 | Barrier Oxide Layer |
| 13 | Upper Copper Conductor Layer |
| 14 | Porous Oxide Layer |

-continued

REFERENCE NUMERALS USED IN DRAWINGS

| 15 | Lower Copper Conductor Layer |
| 17 | Thermal Via |
| 18 | Solder Layer |
| 19 | Solder Resist Mask |
| 20 | Aluminum Laminate |
| 21 | Secondary Dielectric Layer |
| 22 | Copper Deposition Layer |
| 23 | Thermally Conductive Dielectric Adhesive Layer 1 |
| 24 | Thermally Conductive Dielectric Adhesive Particles |
| 25 | Thermally Conductive Dielectric Adhesive Layer 2 |
| 27 | Metallic Substrate |
| 31 | Aluminum Anodize Primary Oxide Layer |
| 32 | Aluminum Anodize Secondary Barrier Oxide Layer |
| 33 | Aluminum Deposition Layer |
| 34 | Aluminuni Anodize Secondary Porous Oxide Layer |
| 35 | Aluminum Anodize Secondary Oxide Layer |
| 36 | Tin/Silver Deposition Layer |
| 37 | Low-Cost Dielectric Adhesive |
| 48 | Annular Area |
| 49 | Heat Transfer Area |
| 51 | Place Holder |
| 53 | Etched Aluminum Surface |

DESCRIPTION—FIGS. 1 TO 5

FIG. 1 shows a cross-section view of a multilayer wiring board 10 attached to a metallic substrate 27 by the prior art method. Metallic substrate 27 is a flat metal plate having the desired physical characteristics. The primary materials used are aluminum and copper. Copper has a very high thermal conductivity (390 W/m K). Aluminum has a relatively high thermal conductivity (230 W/m K) and weighs just 30% of copper. Both materials are readily available and inexpensive. In some specialized applications copper-invar or copper-molybdenum substrates are used for their low coefficient of thermal expansion.

It is understood that the term "aluminum metallic substrate" is used herein to refer not only to essentially pure aluminum having a purity in excess of 99%, but also to alloys of aluminum which have an aluminum content in excess of about 70%, and metals and non-metals, clad with aluminum, or aluminum alloys, or other valve metals. Metals alloyed with aluminum typically include not only one or more deliberately added alloying elements, but also impurities such that the alloy contains, for example, a minor amount by weight of silicon, iron, copper, manganese, magnesium, molybdenum, chromium, nickel, zinc, gallium, vanadium, titanium, boron, lithium, or zirconium.

Alloys of aluminum preferred after 99% pure aluminum are those from AA 1XXX, AA 2XXX, AA 3XXX, AA 5XXX, AA6 XXX, and AA7 XXX, particularly 1045, 1100, 2090, 2024, 3003, 5042, 5182, 5657, 5252, 6061, 6463, 7075, and 7576.

Multilayer wiring board 10 is constructed of a dielectric base material 11. Several materials are used as dielectric base material 11 in the industry depending on the desired physical properties of finished multilayer wiring board 10. In FIG. 1a flexible film is shown. These flexible materials include polyimide, polyester terephthalate, random fiber aramid, polyamide-imide tetrafluoroethylene, and polyvinyl chloride. Dielectric base material 11 does not have to be a flexible film. Rigid material laminates such as e-glass, s-glass, quartz, or aramids can be mixed with various resins (usually epoxy-based) to form a rigid base dielectric layer.

Dielectric base material 11 is coated with an upper copper conductor layer 13, and a lower copper conductor layer 15. Copper is used almost exclusively in the industry as an electrically conductive wiring trace. To enhance the heat transfer from upper copper conductor layer 13 to lower copper conductor layer 15, a plurality of thermal vias 17 may be used. Thermal via 17 is usually punched as a pattern into dielectric base material 11 before it is coated with the upper and lower copper conductor layers 13 and 15. In this manner, when a copper conductor layer is deposited onto dielectric base material 11, all areas of the copper conductor layer will be deposited in an equal thickness.

Various electronic components are soldered to upper copper conductor layer 13. To prevent the solder material from spreading into other areas, a solder resistant mask 19 is usually attached to the upper surface of multilayer wiring board 10. Solder resistant mask 19 can be permanent or temporary and a wide variety of materials and processing methods are used by those practiced in the art.

After multilayer wiring board 10 is completed, it may be laminated to metallic substrate 27. In high performance systems the attachment method usually consists of a thermally conductive dielectric adhesive layer 23 and 25. This adhesive may contain thermally conductive dielectric adhesive particles 24 and fillers that enhance the overall thermal conductivity of thermally conductive dielectric adhesive layer 23 and 25. Metal-coated glass spheres and nickel-plated graphite fibers are commonly used in the industry.

Because high thermal conductivity and high dielectric strength are not usually found in the same material, those skilled in the art of circuit board manufacture may use a very thin secondary dielectric layer 21 to ensure that there are no electrical "shorts" between lower copper conductor layer 15 and metallic substrate 27. Secondary dielectric layer 21 may consist of the same material used as the primary dielectric or another material. Thicknesses of less than 1-mil are common. Secondary dielectric layer 21 also serves to minimize electrogalvanic corrosion between lower copper conductor layer 15 and metallic substrate 27, which is usually aluminum. Those skilled in the art recognize that thinner materials are more prone to pinholes which may destroy the dielectric properties of the laminate.

Those skilled in the prior art may replace thermally conductive dielectric adhesive layer 1, 23 and secondary dielectric layer 21 with a single layer of low-cost solder resist mask 19. Because many solder resist materials are known to be poor conductors of thermal energy, this approach is seen less often in high-performance assemblies.

Figure 2A:
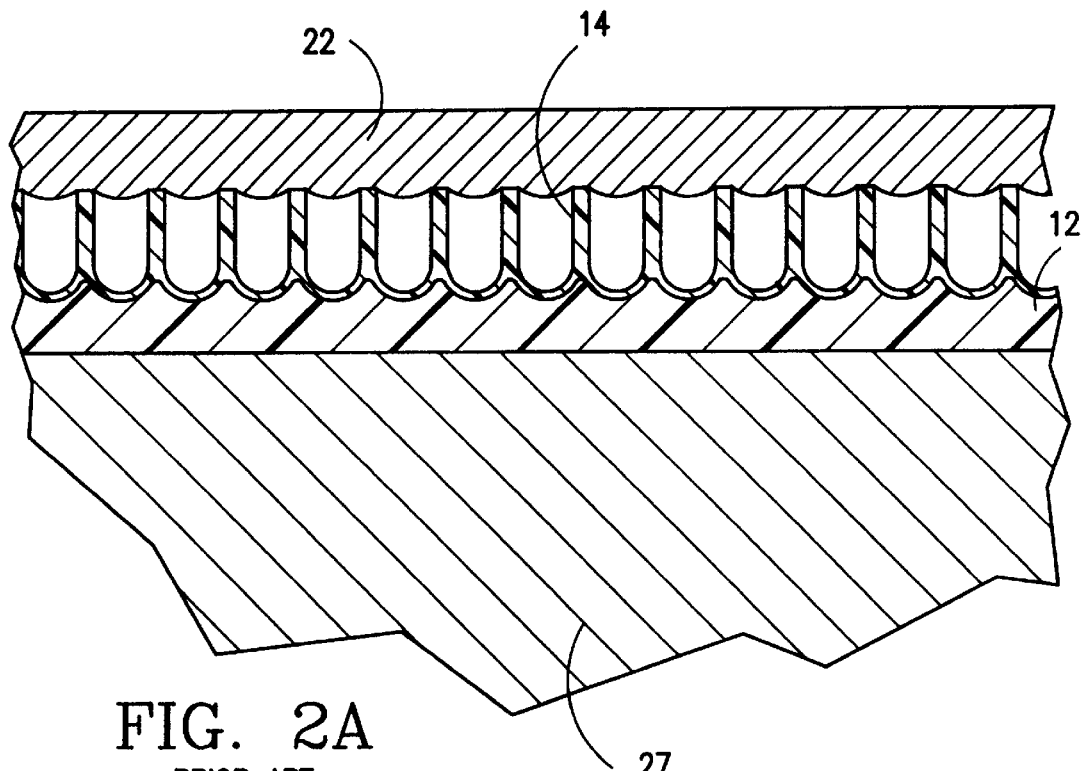
FIG. 2A is a cross-section of the prior art at the microscopic level showing poor adhesion and poor thermal conductivity, but good dielectric strength.

FIG. 2A shows a microscopic cross-section view of the anodization layer of an aluminum substrate of the prior art. The naturally-occurring anodic film is grown to a substantial thickness by anodic processing in acidic baths. Metallic substrate 27 in this case, aluminum, is anodized with a process such as taught in U.S. Pat. No. 4,481,083 to Ball or U.S. Pat. Nos. 4,894,126 and 4,898,651 to Mahmoud. These specifications teach a process for increasing the dielectric strength of the anodize layer. As shown in FIG. 2A, the anodize layer of aluminum metallic substrate 27 is formed of a barrier oxide layer 12 and a porous oxide layer 14. Barrier layer 12 is formed first, but then dissolution actions prevail and a thicker porous oxide layer 14 forms above barrier layer 12. A substantial portion of the anodic film is dissolved in the anodizing solution. The height, cell size, and wall thickness of porous oxide layer 14 is dependant on the voltage applied to the bath. Pore diameter is more closely related to the anodizing solution, temperature, and current density. A copper deposition layer 22 is formed on the aluminum oxide layer. Although these processes form a surface of tightly spaced anodize pores, The primary reason that dielectric strength is high is because copper deposition layer 22 is unable to penetrate the smaller pores when applied as a foil as taught in the prior art. This also results in an assembly having low adhesion between copper deposition layer 22 and the aluminum oxide layer. Thermal conductivity is very low in assemblies using these processes.

Figure 2B:
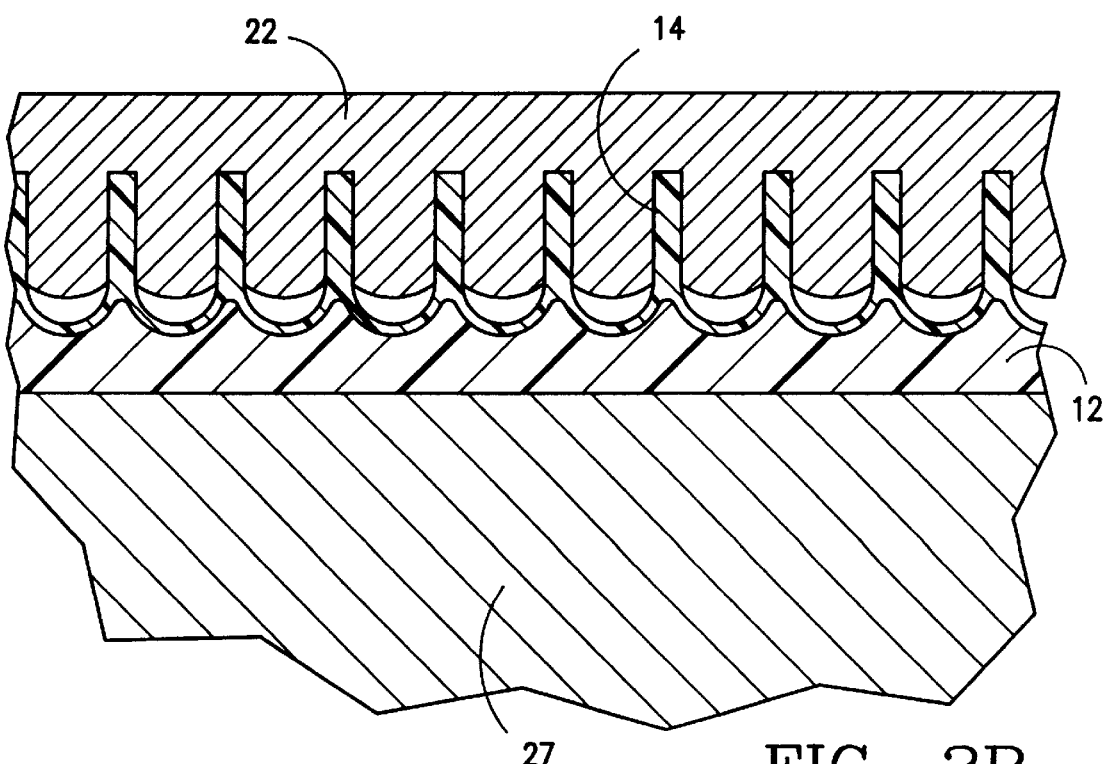
FIG. 2B is a cross-section of the prior art at the microscopic level showing good adhesion and good thermal conductivity, but poor dielectric strength.

FIG. 2B shows a microscopic cross-section view of the anodization layer of an aluminum substrate of the prior art. Aluminum metallic substrate 27 is anodized with a standard sulfuric anodize process. Although the pore sizes are larger and not as tightly spaced, barrier oxide layer 12 is still approximately the same thickness. In this assembly, thermal conductivity and bond strength are greatly enhanced because of the penetration of copper deposition layer 22 into the pores of porous oxide layer 14. Dielectric strength is greatly reduced because of the proximity of copper deposition layer 22 to aluminum metallic substrate 27. It is important to note that when a conductor layer is placed on the aluminum anodize surface, the pore size is the primary determiner of dielectric strength, not the thickness of the anodize. Only if the pore size is identical, will dielectric strength increase with a thicker anodize layer. Also note that the dielectric strength and thermal conductivity of the aluminum oxide material remains unaffected by the anodize process used. Pure aluminum oxide has a dielectric strength of about 400–500 VDC/mil and a thermal conductivity of about 40 W/m K.

Figure 3A:
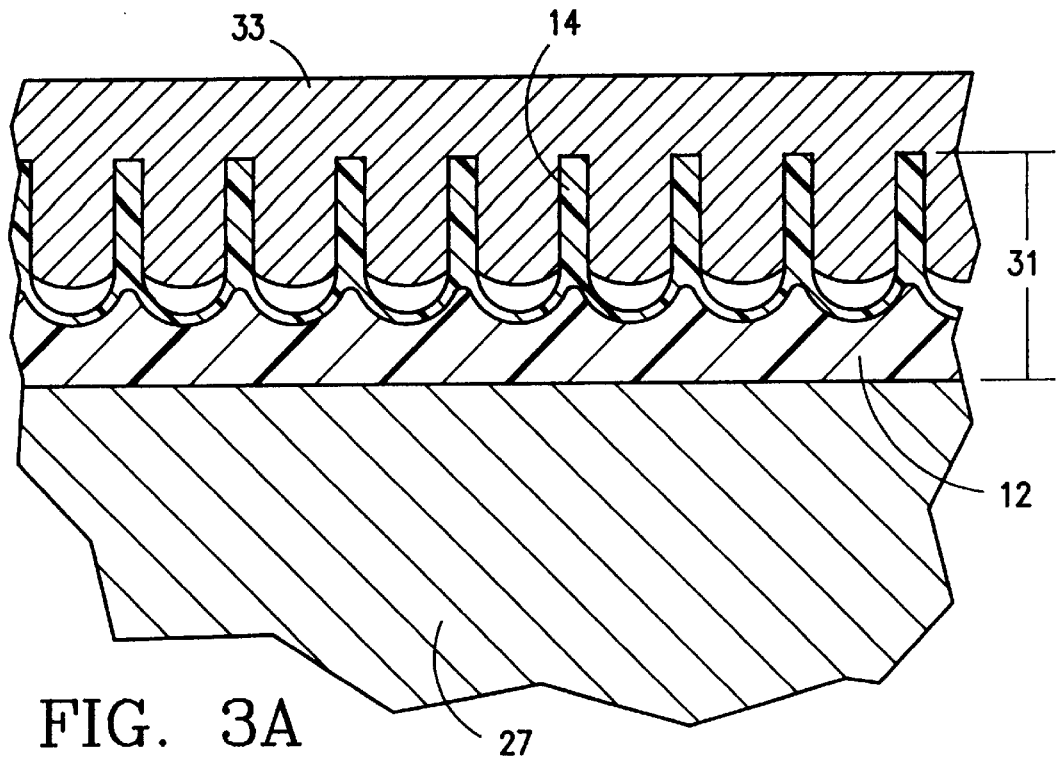
FIG. 3A is a cross-section of a portion of a partially processed multilayer laminate according to the present invention showing the various layers of the laminate comprising an aluminum substrate-aluminum oxide primary layer-deposited aluminum laminate structure.

FIG. 3A shows a partially processed embodiment of the current invention. Aluminum metallic substrate 27 is processed to obtain an aluminum anodize primary oxide layer 31 ($Al_2O_3$). This is formed on the surface of aluminum metallic substrate 27 by a standard low-cost process. Aluminum anodize primary oxide layer 31 consists of barrier oxide layer 12 and porous oxide layer 14. A layer of greater than 99.89% pure aluminum 33 is deposited onto aluminum anodize primary oxide layer 31. Because of the large pores produced by the standard anodizing process, aluminum deposition layer 33 forms a high adhesion bond to aluminum anodize primary oxide layer 31.

Figure 3B:
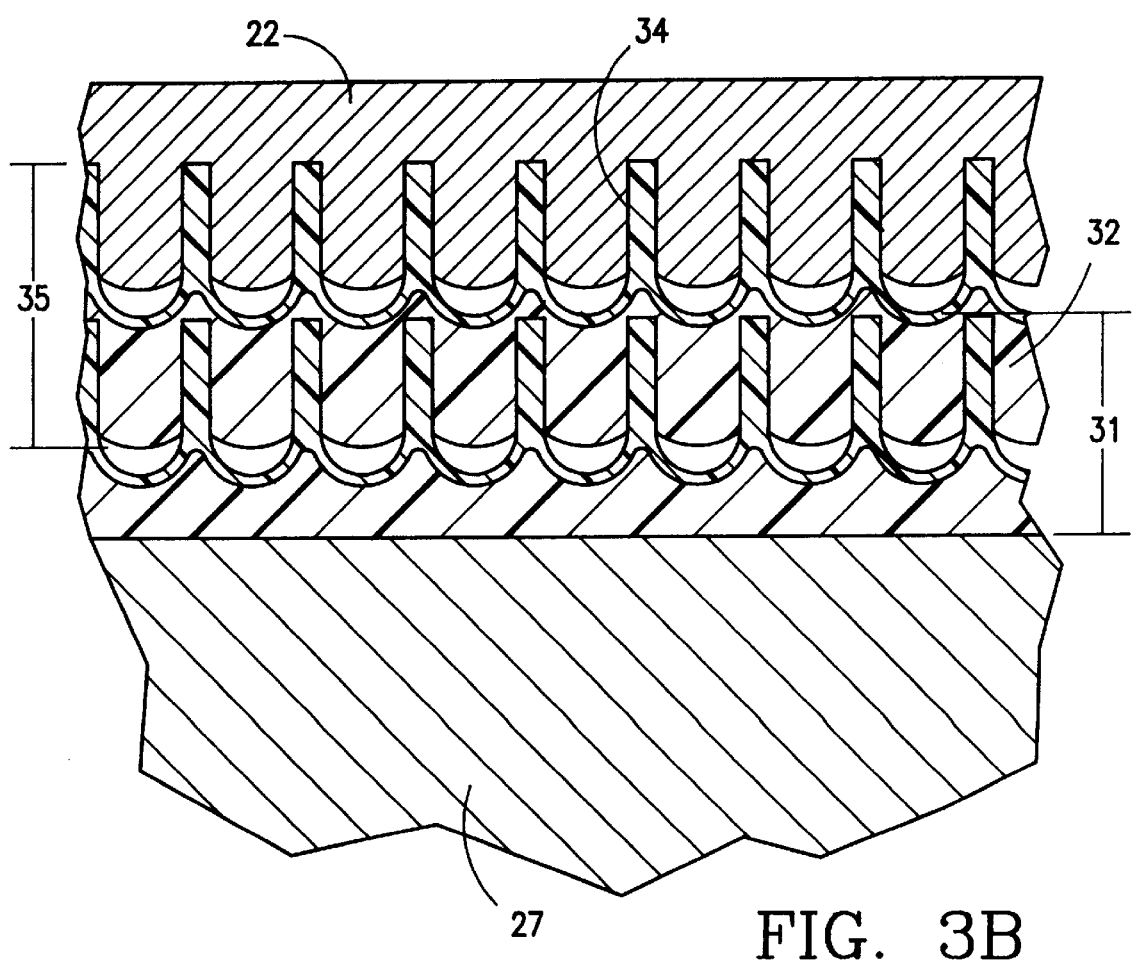
FIG. 3B is a cross-section of a portion of a partially processed multilayer laminate according to the present invention showing the various layers of the laminate comprising an aluminum substrate-aluminum oxide primary layer-interlocked aluminum oxide secondary layer-copper conductor deposition layer laminate structure.

FIG. 3B shows another partially processed embodiment of the current invention. The partially processed aluminum substrate of FIG. 3A has been anodized so that aluminum deposition layer 33 has been oxidized to form an aluminum anodize secondary oxide layer 35 consisting of an aluminum anodize secondary barrier oxide layer 32 and an aluminum anodize secondary porous oxide layer 34. Because of the interlocking layers, of aluminum anodize primary anodize layer 31 and aluminum anodize secondary oxide layer 35, a very high bond strength has been achieved. Because copper deposition layer 22 is a further distance from metallic substrate 27 than in the prior art, dielectric strength is increased. Increased dielectric strength is also achieved by the introduction of aluminum anodize secondary barrier oxide layer 32. This second barrier oxide layer disturbs the path of electrical conductivity that is apparent in the prior art when using one thick anodize layer. The increased distance between copper deposition layer 22 and metallic substrate 27 increases the thermal resistance of the assembly, but not greatly, since the thermal conductivity of aluminum oxide is approximately 10 to 20 times better than the thermal adhesive that might otherwise have been used.

Copper deposition layer 22 is then formed onto aluminum anodize secondary oxide layer 35. Copper deposition layer 22 does not have to be copper. In order to obtain a good solder bond, wetting is important. In a decreasing order of intrinsic wettability, preferable materials are: tin, tin-lead >copper>palladium-silver, platinum-silver, palladium-platinum-silver>nickel.

A solder layer 18, is applied to copper deposition layer 22. The preferred solder composition is application specific. In any case, the solder layer should have a melting temperature above the maximum temperature used to solder the components onto the upper copper conductor layer 13. In the preferred embodiment, for electronic circuitry using a 60% tin and 40% lead (Sn60Pb40) near-eutectic composition solder with a melting range of 183° C. to 190° C. for component attachment, solder layer 18 is composed of a eutectic of 95% tin and 5% silver (Sn95Ag5) solder with a melting temperature range of 221° C. to 245° C. This solder has the added advantage of being lead-free and has a higher thermal conductivity than Sn60Pb40 solder.

Solder layer 18 may be applied by an electroplating method, to circuit board lower copper conductor layer 15 or to aluminum substrate copper conductor layer 22. In some applications, it is preferred that solder layer 18 be applied as a solder paste. When applied as a solder paste, the mixture should contain a minimum of 95% solder alloy material. Some low-residue solder pastes are designed as low-residue by containing a large portion of flux that will decompose and vaporize during the soldering process. The volume of vapor produced during soldering is much greater than the liquid solder volume. These types of solder paste are unacceptable if there are not a large number of thermal vias or other vents in the circuit to allow the vapor to escape. Increased pressure at elevated temperatures may cause the trapped vapor to delaminate the assembly.

Figure 5A:
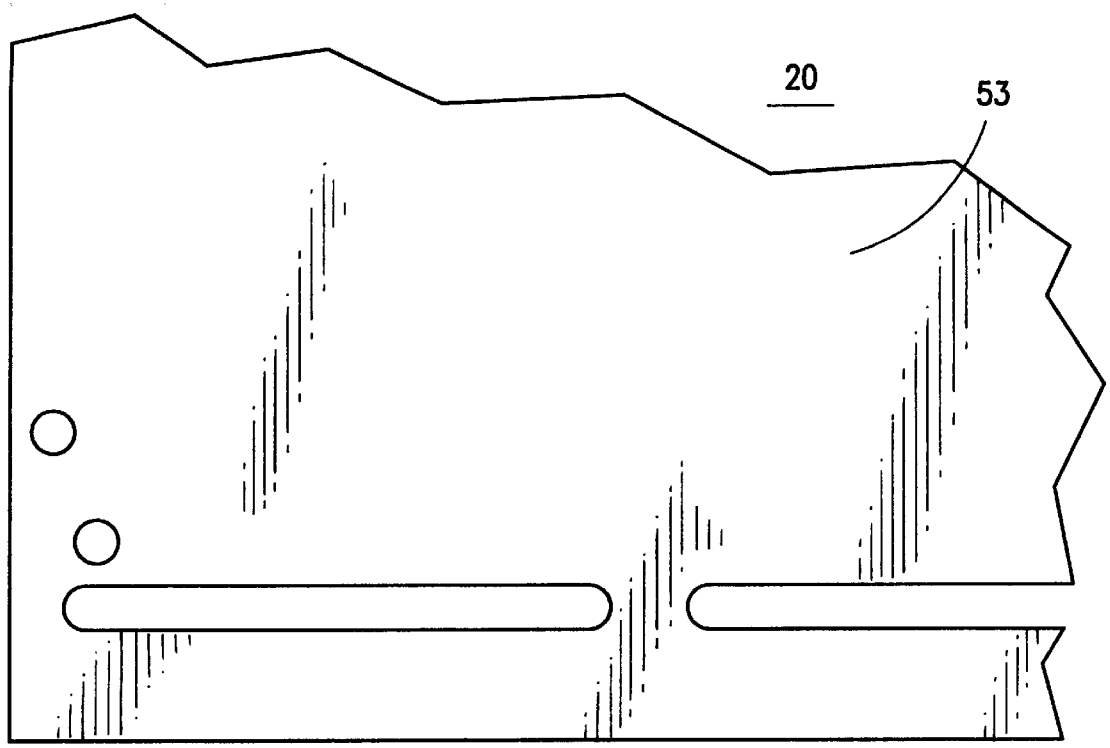
FIGS. 5A through 5H are views of the stages of processing of the metallic substrate of the present invention. Wherein 5A is etching, 5B is placeholder attachment, 5C is primary anodization, 5D is aluminum layer deposition, 5E is secondary anodization, 5F is placeholder removal, 5G is copper layer deposition, and 5H is electrically/thermally conductive bond layer, and dielectric bond layer, deposition.
Figure 5B:
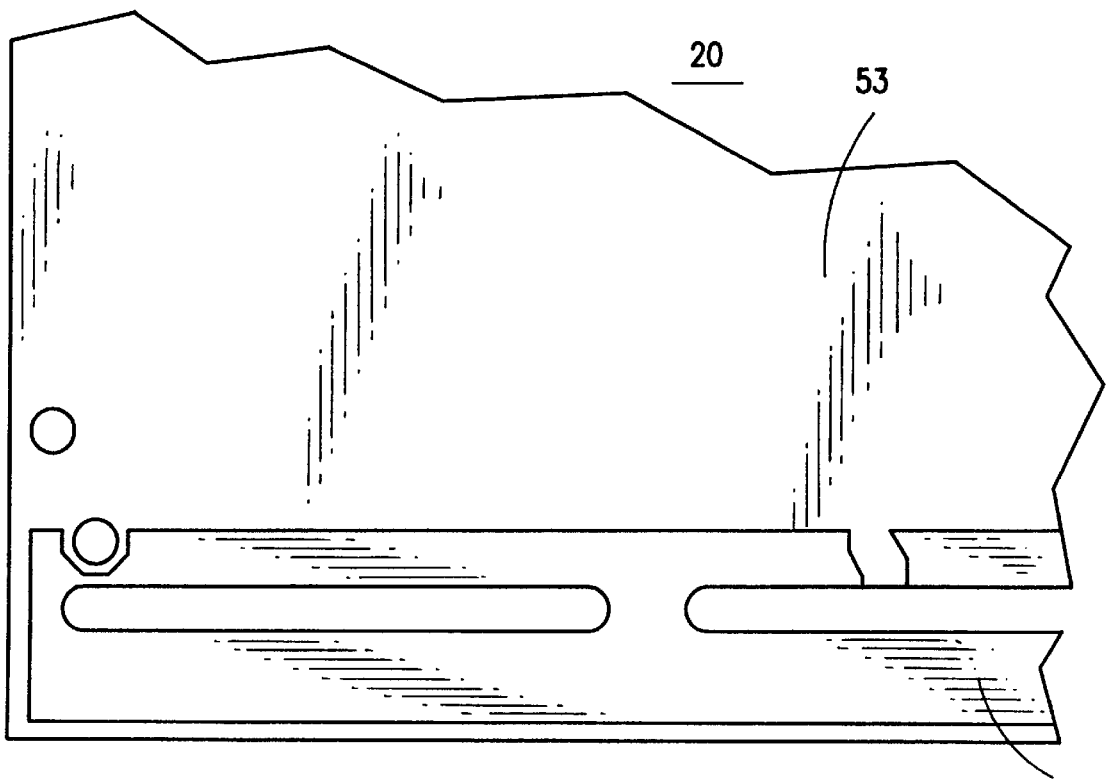
Figure 5C:
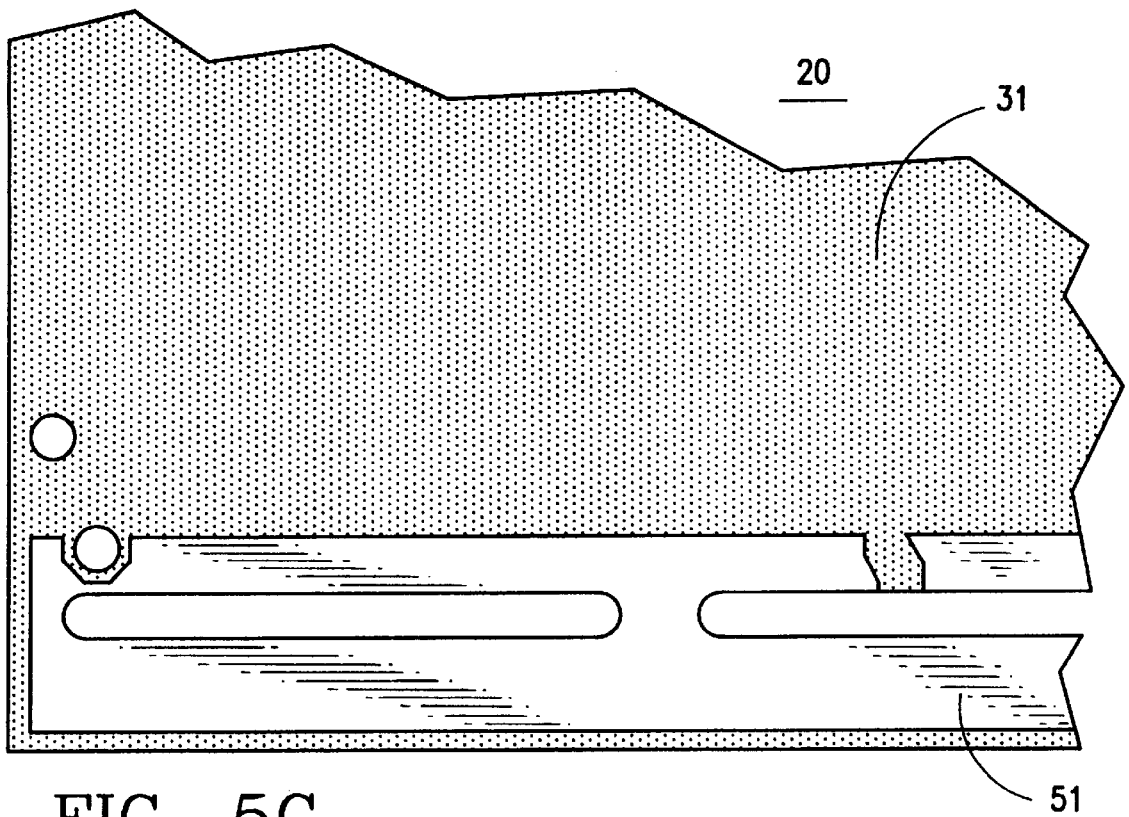
Figure 5D:
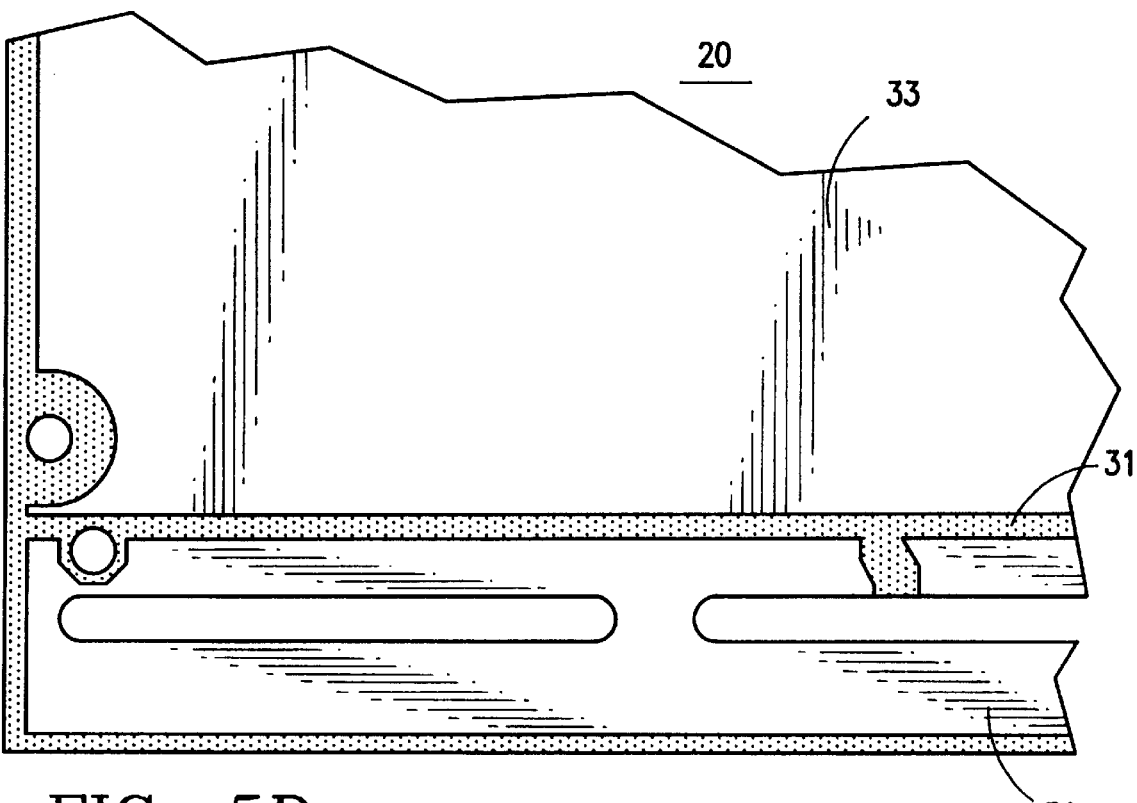
Figure 5E:
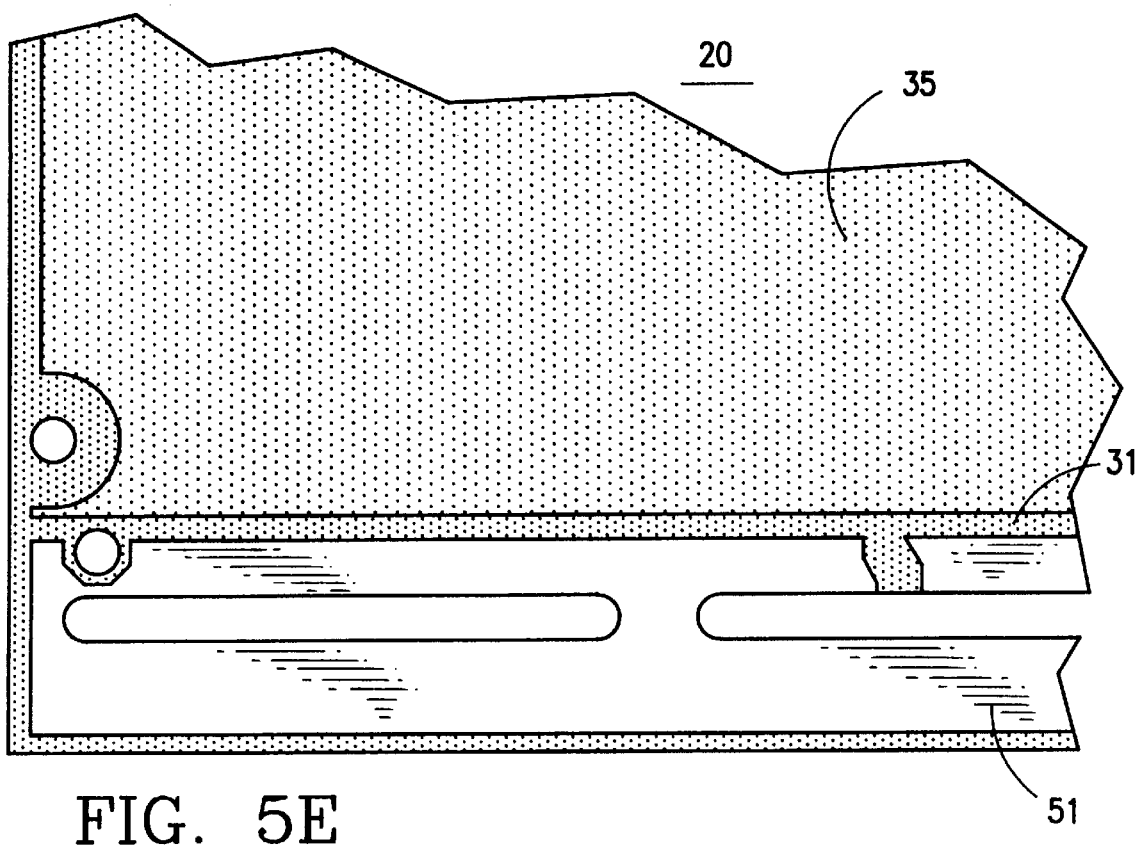
Figure 5F:
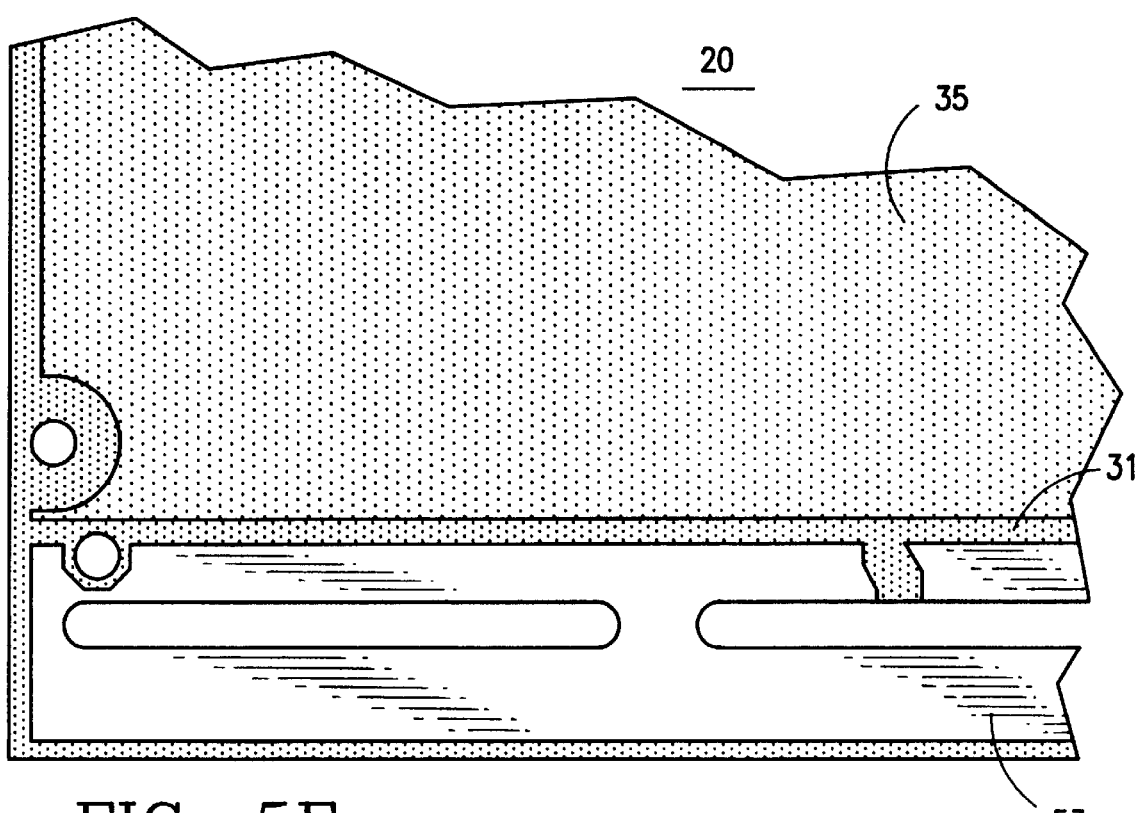
Figure 5G:
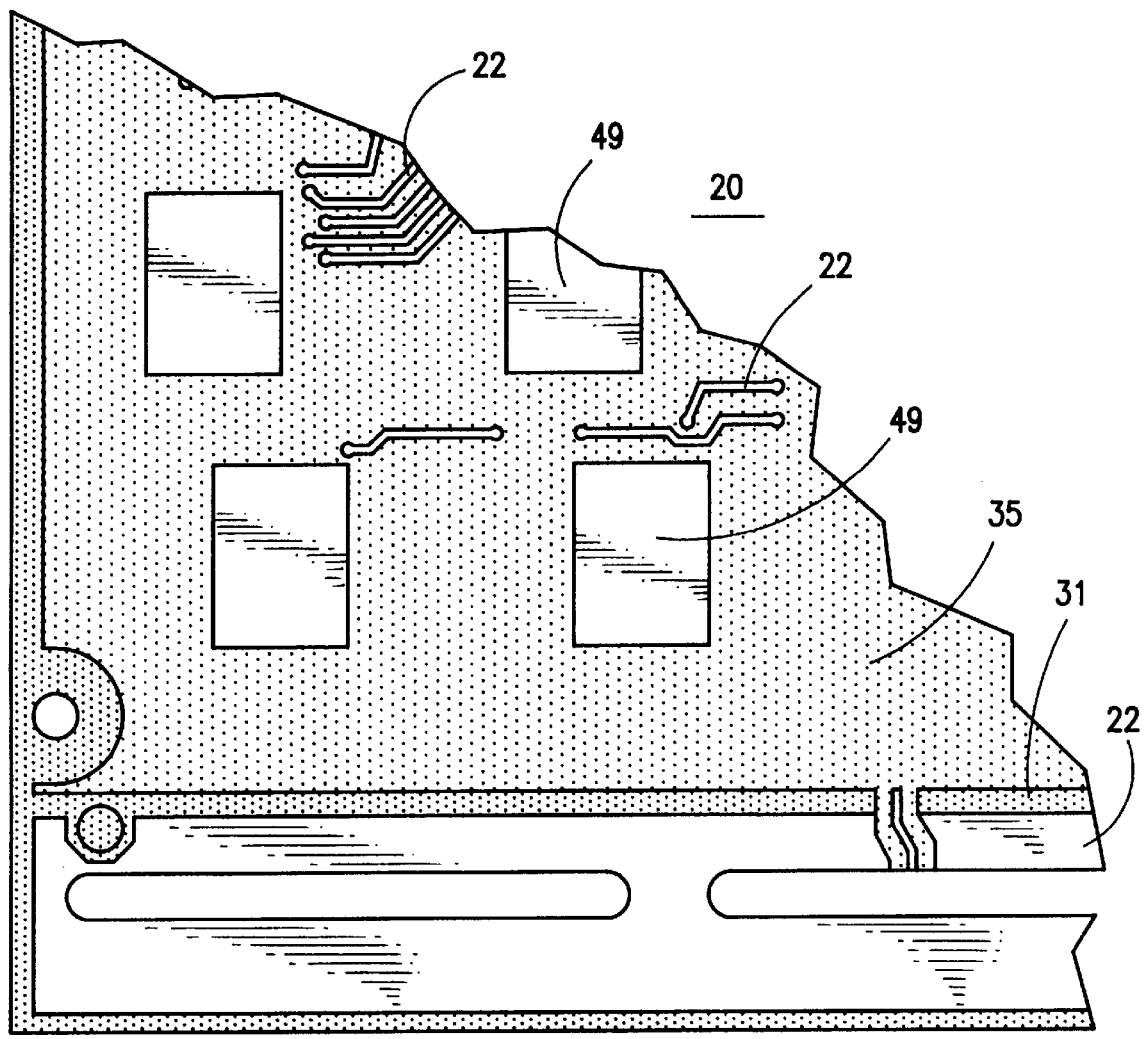
Figure 5H:
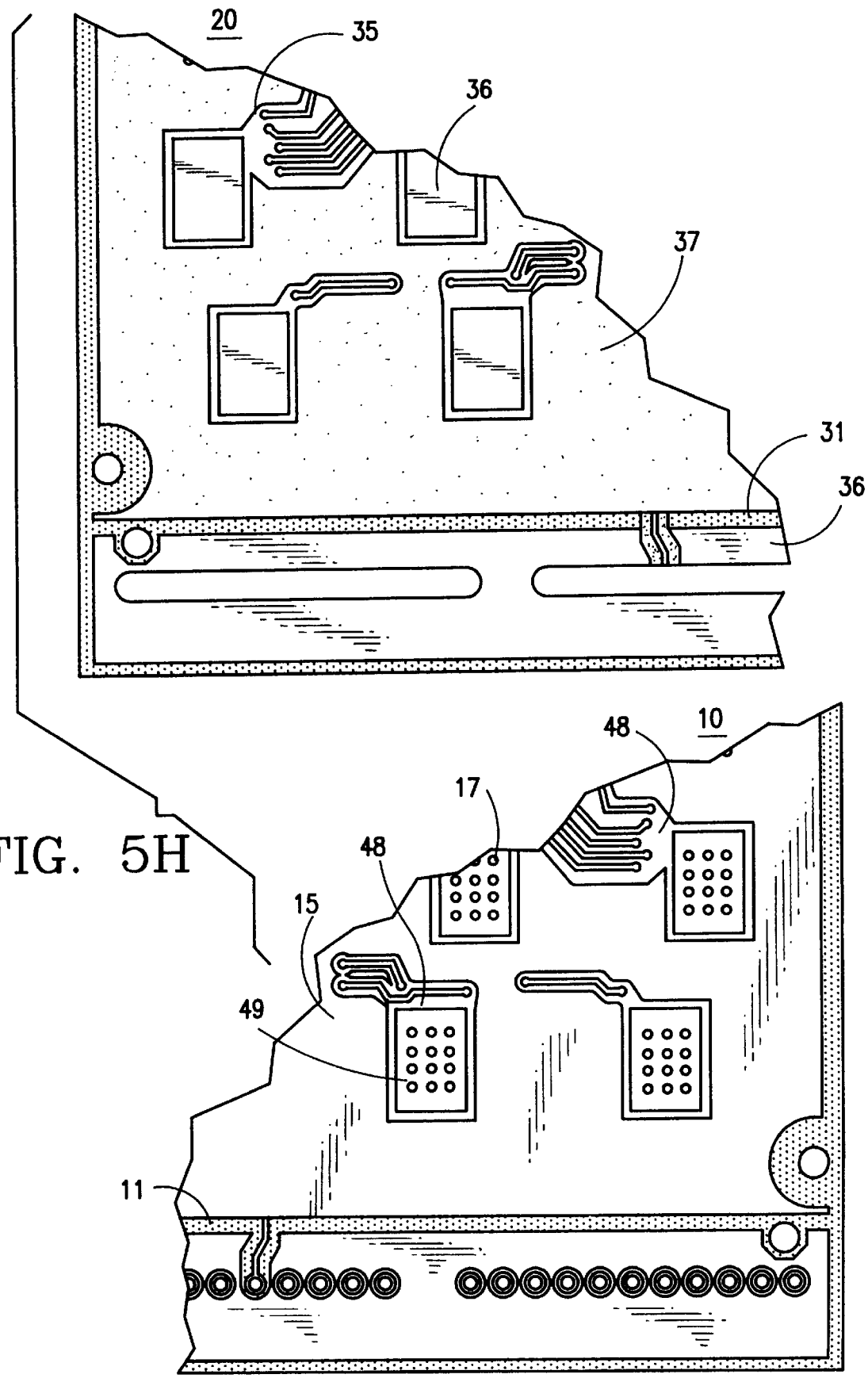

Referring now to FIG. 5H, the circuit should be constructed so that an annular area 48 is maintained around a heat transfer area 49. During the circuit/substrate attachment process, flux that may disrupt the heat transfer path is allowed to collect in the annular area. Annular area 48 should have an area that is greater than twice the percentage of solder flux in heat transfer area 49. For example, if heat transfer area 49 is 0.50 inches by 0.50 inches (0.25 inch$^2$) and a 5% flux solder is used, annular area 48 should be at least (0.25 inch$^2$×0.05×2=) 0.025 inch$^2$ or about 0.525 inches by 0.525 inches.

FIG. 4 shows a cross section of the preferred embodiment of the current invention. Aluminum anodize primary oxide layer 31 has been applied to aluminum metallic substrate 27. Pure aluminum has been applied to aluminum anodize primary oxide layer 31 and anodized again to form aluminum anodize secondary oxide layer 35. Copper deposition layer 22 has been formed onto aluminum anodize secondary oxide layer 35 and displays good adhesion, thermal conductivity and dielectric strength to aluminum metallic substrate 27. Solder layer 18 is applied to copper deposition layer 22 and/or to lower copper conductor layer 15 of multilayer wiring board assembly 10.

FIGS. 5A through 5H show the preferred method of processing an aluminum laminate 20.

Referring now to FIG. 5A, partially processed aluminum laminate 20 is shown with an etched aluminum surface 53.

Referring now to FIG. 5B, partially processed aluminum laminate 20 of FIG. 5A is shown with a portion of etched aluminum surface 53 masked with a place holder 51. Place holder 51 can be any material which will exhibit good adhesion, eliminate contact with the atmosphere, be unaffected by sulfuric acid, and withstand temperature ranges from 5° C. to 300° C. Polymeric tape is often used for this purpose. It is important to apply place holder 51 to the desired area immediately after the etching process. Aluminum forms an undesirable oxide layer upon exposure to the atmosphere. This oxide layer may interfere with the electrical conductivity of subsequent operations.

Referring now to FIG. 5C, partially processed aluminum laminate 20 of FIG. 5B is shown with etched aluminum surface 53 converted to aluminum anodize primary oxide layer 31. Aluminum anodize primary oxide layer 31 is formed by a standard sulfuric acid process. Many techniques are known in the art of sulfuric anodizing. The process should apply a 0.0005 inch thick anodic coating to etched aluminum surface 53. Place holder 51 prevents the anodization of a portion of aluminum laminate 20.

Referring now to FIG. 5D, partially processed aluminum laminate 20 of FIG. 5C is shown with aluminum deposition layer 33 formed onto aluminum anodize primary oxide layer 31. Because the cost of some methods of aluminum deposition are affected by the area covered by the aluminum deposit, the present invention is shown with only the necessary area processed to form aluminum deposition layer 33. Place holder 51 prevents aluminum deposition layer 33 from affecting etched aluminum surface 53 under place holder 51.

Referring now to FIG. 5E, partially processed aluminum laminate 20 of FIG. 5D is shown with aluminum deposition layer 33 converted to aluminum anodize secondary oxide layer 35. Aluminum anodize secondary oxide layer 35 is also formed by a standard anodize process. The process should form a 0.0005 thick anodic coating from aluminum deposition layer 33. Since aluminum anodize primary oxide layer 31 is already a dielectric with a strength greater than 1,000 VDC, aluminum anodize secondary oxide layer 35 will not affect this layer. Place holder 51 prevents the anodization of a portion of aluminum laminate 20.

Referring now to FIG. 5F, partially processed aluminum laminate 20 of FIG. 5E is shown with place holder 51 removed. Etched aluminum surface 53 is now exposed to subsequent processing. Place holder 51 must be removed just before further processing, otherwise an anodic coating will form and the subsequent processes will be compromised.

Referring now to FIG. 5G, partially processed aluminum laminate 20 of FIG. 5F is shown with copper deposition layer 22 formed onto specific areas of aluminum anodize secondary oxide layer 35. Copper deposited in this manner will have high adhesion and high thermal conductivity to aluminum anodize secondary oxide layer 35, but will remain electrically isolated from aluminum metallic substrate 27 shown in FIG. 4. The critical areas for heat transfer 49 receive copper deposition layer 22 along with areas that duplicate the copper conductor traces of the multilayer wiring board. By duplicating the copper conductor traces of multilayer wiring board 10 on aluminum laminate 20 the copper conductor traces can carry more current without overheating for a given conductor width and thickness. The copper deposited in the area that was previously protected by place holder 51 is now in intimate electrical contact with aluminum metallic substrate 27 of FIG. 4. Because place holder 51 prevented the formation of an aluminum oxide layer, this area exhibits good adhesion and thermal conductivity. In addition, since the copper is deposited directly onto the aluminum substrate with no interstitial material, there is no path for moisture absorption between the layers. This results in the elimination of electrogalvanic corrosion activity.

Referring now to FIG. 5H, partially processed aluminum laminate 20 of FIG. 5G is shown with a portion of partially processed multilayer wiring board 10. Multilayer wiring board 10 is shown as being constructed of lower copper conductor layer 15 deposited to dielectric base material 11. Multilayer wiring board 10 is shown with a plurality of thermal vias 17 located in critical areas of heat transfer 49. Heat transfer annular area 48 is provided around all solderable areas to act as a depository for solder flux contained in the solder paste and to prevent solder from spreading under pressure to adjacent conductor areas. Aluminum laminate 20 is shown with a layer of tin/silver solder 36 deposited onto all exposed copper areas of FIG. 5F. Tin/silver solder can be in the form of an electrically deposited layer, or a solder paste. A low-cost dielectric adhesive 37 is used to bond multilayer wiring board 10 to aluminum laminate 20 in all areas that will not be soldered, or are used as annular areas for bridging protection.

DETAILED DESCRIPTION OF THE PREFERRED EMBODIMENTS

The following is an illustrative example in which typical process conditions are used for fabricating a multilayer wiring board laminate with enhanced thermal dissipation to a dielectric substrate laminate.

Referring now to FIG. 5A, aluminum metallic substrate 27 is cleaned and etched to provide a proper surface for subsequent operations. A typical alkali etchant utilized in the practice of the subject invention includes 20 g/l sodium hydroxide, 25 g/l sodium gluconate and 0.1 ml/l tergitol. The duration of exposure to the etchant is a function of the surface contamination and is determined empirically. After etching, aluminum metallic substrate 27 should be rinsed in a flowing bath of deionized water at 45° C. to 55° C. for 1 to 2 minutes.

The subsequent steps of cleaning, polishing, place holder attachment, and anodizing must be performed with a minimum of lag time between processes. Aluminum immediately self-anodizes when in contact with air. This uncontrolled anodization layer is detrimental to subsequent processes.

The aluminum substrate may then proceed to a subsequent polishing process. The polishing process is not necessary and is optional depending on the degree of surface finish achieved during the previous cleaning and etching process. The polishing process is actually a micro-etch bath which aids in formation of nucleation sites during the subsequent anodizing step. When the micro-etch bath is used, the requirement of wetting agents in the anodizing solution is greatly reduced. One polishing process which has shown good results is immersing aluminum metallic substrate 27 in a polishing bath comprising 784 milliliters phosphoric acid, 98 milliliters nitric acid, 40 grams sodium nitrate, and 118 milliliters of deionized water. The substrate is agitated in this solution for 2 to 3 minutes while maintaining the bath at a temperature of 80° C. to 90° C.

After the polishing step, aluminum metallic substrate 27 should be rinsed in a flowing bath of deionized water at 45° C. to 55° C. for 1 to 2 minutes.

Referring now to FIG. 5B, place holder 51 may be attached to etched aluminum surface 53 of aluminum metallic substrate 27. Place holder 51 prevents the formation of an aluminum oxide layer. In many electronic designs, electrical conductivity may be required between specific circuit paths and an external case. This external case may then be used as an electrical ground plane or to shield the internal circuit paths from external Electro-Magnetic Interference (EMI) or Radio Frequency Interference (RFI). Referring to FIG. 5G, after removal of place holder 51, copper deposition layer 22 may be applied directly to the pure, unanodized aluminum surface. This metallic layer will display very low electrical impedance to aluminum metallic substrate 27.

Referring again to FIG. 5B, so-treated aluminum metallic substrate 27 is then subsequently positioned in a suitable electrolyte and electric current is directed therethrough in such a manner as to render aluminum metallic substrate 27 cathodic to activate the surface thereof. The exact electrolytic composition utilized may be varied and many such compositions are known to those skilled in the art. However, one electrolytic composition which has been found to be useful for this purpose includes, in percent by volume, about 63% phosphoric acid, 15% sulfuric acid, and 22% water. Typically, the voltage across aluminum deposition layer 33 ranges from about 3 to 15 volts and the current density ranges from about 220 to 1100 amps/$M^2$.

Referring now to FIG. 5C, aluminum anodize primary oxide layer 31 is formed by many processes known to those in the art. The following process produces a tightly grained anodic layer. The anodize bath is composed of a solution of 974 milliliters deionized water, 20 milliliters sulfuric acid, 5.5 grams citric acid, 3 grams urea, and 6 milliliters ammoniated colloidal silica (Ludox AS-40, E.I DuPont) per liter. The bath or the aluminum substrate must be continuously agitated either by air bubbles, mechanical motion, or other means. The bath temperature should be maintained at 5° C. to 15° C. The bath should have a method of continuously cooling because the current applied to the aluminum substrate and resistance caused by the formation of dielectric aluminum anodize primary oxide layer 31 will cause an increase in bath temperature. An initial current density of 320 Amperes/$meter^2$ to 540 Amperes/$meter^2$ at 75 VDC should be applied to aluminum metallic substrate 27. The initial current density and voltage should be applied within 10 to 15 seconds of immersion of the aluminum substrate in the anodizing bath. During the formation of aluminum anodize primary oxide layer 31 the current will rise slowly, then quickly, until stabilization. After this initial stage, the current and voltage should remain constant for 15 minutes to 20 minutes. During the later stage of processing, the current will decay while the voltage increases. Finally, current will reach zero and the voltage will increase to the maximum allowed by the power supply, previously set at 75 VDC.

Aluminum anodize primary oxide layer 31 will form at the rate of 15 angstroms per second. Aluminum metallic substrate 27 should be left in the bath for approximately 30 minutes, to form a 1-mil thick anodic layer.

After anodizing, aluminum metallic substrate 27 should be rinsed in a flowing bath of deionized water at 45° C. to 55° C. for 1 to 2 minutes. In a standard anodize process this rinse would be immediately followed by a hot water sealing bath, but this is detrimental to the present invention.

In the preferred embodiment, the entire plate may be anodized in the prescribed manner. The anodic coating, in addition to dielectric strength, increases the emissivity of the natural aluminum surface from about 0.2, to approximately 0.8. Since the object of the invention is to dissipate heat, this oxide layer proves to be beneficial.

Referring now to FIG. 5D, aluminum deposition layer 33 is precipitated on aluminum anodize primary oxide layer 31. Many processes are known to those knowledgeable in the art of aluminum deposition, these include sputtering, electroplating, and plasma spray. One technique which has proven to meet the requirements of the present invention is chemical vapor deposition. In one embodiment of this process, a vacuum chamber containing the present invention is evacuated to a base pressure of 5 millitorr. The vacuum chamber is equipped with a pump capable of a rate of volumetric speed of 20,000 liters per minute. An evaporation apparatus causes a fine aluminum wire to vaporize. Molten aluminum reacts with all refractory metals and some prophylactic measured should be taken. The aluminum vapor is entrained in a high speed carrier gas flow and swept in the jet downstream on to the surface of aluminum anodize primary oxide layer 31. Expansion of the gas through the deposition nozzle should reach approximately $10^5$ cm/sec. On this surface, and penetrating into the pores, the aluminum evaporate condenses and causes a film growth. To apply an even coating of 150 nm on a 650 cm$^2$ area, a typical process has a rotation rate of 2 revolutions/sec, a scan rate of 12 cm/min, scan length of 6.5 cm, and 40 scan passes, for a total run time of 15 minutes.

The area covered by aluminum deposition layer 33 is application dependant. In general, the cost associated with this process is dependant upon the area covered and the thickness of the applied layer. In the preferred embodiment aluminum deposition layer 33 covers the area that will be used to adhere the multilayer wiring board, and the area required to deposit electrically conductive wiring traces, both shown in FIG. 5H.

Immediately after aluminum deposition layer 33 has been formed on aluminum anodize primary oxide layer 31, aluminum metallic substrate 27 should be re-anodized.

If the substrate is prevented from immediate re-anodization, aluminum deposition layer 33 should be micro-etched. Although the micro-etch process is not necessary, the process aids in formation of nucleation sites during the subsequent anodizing step. When the micro-etch bath is used, the requirement of wetting agents in the anodizing solution is greatly reduced. One polishing process which has shown good results is immersing aluminum metallic substrate 27 in a polishing bath comprising 784 milliliters phosphoric acid, 98 milliliters nitric acid, 40 grams sodium nitrate, and 118 milliliters of deionized water. The substrate is agitated in this solution for 1 minutes while maintaining the bath at a temperature of 80° C. to 90° C.

After etching , aluminum metallic substrate 27 should be rinsed in a flowing bath of deionized water at 45° C. to 55° C. for 1 to 2 minutes.

Referring now to FIG. 5E, so-treated aluminum metallic substrate 27 is then subsequently positioned in a suitable electrolyte and electric current is directed therethrough in such a manner as to render aluminum deposition layer 33 cathodic to activate the surface thereof. The exact electrolytic composition utilized may be varied and many such compositions are known to those skilled in the art. However, one electrolytic composition which has been found to be useful for this purpose includes, in percent by volume, about 52% phosphoric acid, 9% sulfuric acid, and 39% water. Typically, the voltage across aluminum deposition layer 33 ranges from about 3 to 15 volts and the current density ranges from about 220 to 1100 amps/m$^2$.

Once aluminum deposition layer 33 of aluminum metallic substrate 27 has been rendered cathodic to activate the surface thereof, if desired, the so-treated aluminum metallic substrate 27 is then water rinsed at room temperature. In this regard, any form of non-contaminated water may be employed to accomplish rinsing during the practice of the invention. Aluminum metallic substrate 27 is then positioned in an electrolytic bath and electric current passed therethrough in such a manner that aluminum deposition layer 33 is rendered anodic to from aluminum anodize secondary oxide layer 35. Suitable electrolytes which are known in the art, may be used for this purpose. However, one electrolytic bath which has been found to be well suited for this purpose includes, in percent by volume, from about 63% phosphoric acid, 15% sulfuric acid, and 22% water.

The voltages that may be applied across aluminum deposition layer 33 are relatively low and range on the order of from about 1 to 5 volts. The current densities resulting from the applied voltages range from about 5 to 160 amps/m$^2$. By following this technique, a relatively loosely grained aluminum anodize secondary oxidize layer 35 is formed from aluminum deposition layer 33.

Because a protective coating, aluminum anodize primary oxide layer 31 has been previously formed, aluminum metallic substrate will be unaffected by this secondary anodization process.

After anodizing , aluminum metallic substrate 27 should be rinsed in a flowing bath of deionized water at 45° C. to 55° C. for 1 to 2 minutes.

Referring now to FIG. 5F, placeholder 51 is removed to expose etched aluminum surface 53 immediately prior to precipitation of copper deposition layer 22.

Again, because of the detrimental nature of the naturally-occurring oxide film, aluminum laminate 20 should proceed immediately from the placeholder removal to copper deposition.

Referring now to FIG. 5G, copper deposition layer 22 may then be deposited on the surface of aluminum anodize secondary oxidize layer 35 and on the etched aluminum surface 53 of aluminum metallic substrate 27. Many methods of forming copper deposition layer 22 are known to those skilled in the art. These methods include many of the same techniques that may be used to form aluminum deposition layer 33, sputtering, chemical vapor deposition, and plasma spray. The deposited copper film may have a thickness of about 0.5 to 1.0 mils. The thickness must be sufficient to form a solderable surface. Typical of an electroplating solution suitable for this purpose is a standard pyrophosphate bath which typically contains 22.5 g/l of copper, 160 g/l of pyrophosphate and has a pH of about 8.3. Electrodeposition of the copper is accomplished by operating the bath at a temperature of about 55° C. to 60° C., at a voltage of about 3 volts and a current density of about 320 amps/m$^2$.

Copper deposition layer 22 may duplicate areas of multilayer circuit board 10 that will require the superior heat transferring properties of the subject invention. These critical areas may consist of high power circuit traces, and power component heat transfer areas 49.

Copper, like aluminum, forms an oxide layer upon exposure to the atmosphere. This copper oxide layer may interfere with subsequent processing. Many methods of anti-oxidizing surface treatments of copper are known to those in the art. In the preferred embodiment, copper deposition layer 22 is coated with a thin layer, 0.3-mil of tin, shown in FIG. 5H.

Referring now to FIG. 5H, the preferred embodiment precipitates a tin/silver layer 36 on all exposed areas of copper deposition layer 22. The tin/silver layer protects copper deposition layer 22 from oxidation. By depositing this layer immediately after copper deposition layer 22, an identical mask may be used. Areas of aluminum laminate 20 that are not critical to heat transfer, but serve to adhere multilayer wiring board 10, may be coated with low-cost adhesive 37. In the preferred embodiment, critical areas of heat transfer 49 of multilayer wiring board 10 may be coated with a thin layer, <0.3-mil of tin (not shown) to preclude oxidation.

A critical step in the manufacture of the subject invention is the bonding operation. In the preferred embodiment, multilayer wiring board 10 is pressed against aluminum laminate 20. Pressure depends on low-cost adhesive 37, but should not exceed about 14,000 kg/m². Pressures greater than this value may squeeze the solder layer too thin. The thickness of the solder layer is recommended to be approximately 0.08 mm. If dielectric layers other than $Al_2O_3$ are used, the difference in the coefficient of thermal expansion (CTE) of the materials must noted. For example, diamond has a CTE of $2.6 \times 10^6$/°C. This compares unfavorably with $Al_2O_3$, at about $6.7 \times 10^6$/°C. when bonded to aluminum at $23 \times 10^6$/°C. In such cases, the solder layer should be made thicker to absorb the stresses created by this difference in CTE. The exact value of solder layer thickness must be determined empirically, but is preferably within a range of 2-mil to 6-mil.

The temperature of the bonding operation must be high enough to cause solder layer 18 to reflow, but not so hot as to damage low-cost adhesive 37 or other temperature sensitive materials.

In the preferred embodiment, using 3M 467MP high performance adhesive, and a 95% tin and 5% silver (Sn95Ag5) solder, the bonding operation should apply 3,500 kg/m² to 7,000 kg/m² of evenly distributed pressure, at 250° C., for 10 sec. More preferably the bonding operation should occur in a gaseous nitrogen ($GN_2$) environment having less than 300 ppm $O_2$.

EXAMPLE 1

A multilayer wiring board laminate 10 using the cross-section construction shown in FIG. 1 was fabricated. A 2.7-mil (2 Oz/ft²) copper thickness was used on conductor surfaces 13 and 15. Twenty 28-mil diameter thermal vias 17 were evenly applied in an area of 0.358 in.². The flexible circuit layer II was 2-mu thick. Two adhesive layers 23 and 25 of 1.5-mil thickness each, and a dielectric polymer layer 21 of 0.25-mil were used to attach the circuit to a 100-mil thick aluminum 6061 substrate 27. The aluminum substrate 27 had an aluminum oxide layer (not shown) applied per a prior art method (MIL-A-8625E, Type II, Class 2, Color:Black), that was approximately 0.5-mil thick. The thermal resistance of this prior art laminate was measured at 1.75° C/W. This measurement was from the upper copper layer 13 to a point directly on the opposite side, on the exterior surface of the aluminum substrate 27. A destructive dielectric strength test method using a 50 µA current sensitivity recorded a 900 VDC breakdown strength in an ambient environment of 125° C. This measurement was taken from the upper copper conductor 13 to the aluminum substrate 27. Retesting at room temperature indicated that the dielectric strength had been reduced to 680 VDC. The reduced dielectric strength is thought to be due to carbon tracking within the dielectric layer.

EXAMPLE 2

A multilayer wiring board laminate 10 using the cross-section construction shown in FIG. 1 was fabricated. A 2.7-mil (2 Oz/ft²) copper thickness was used on conductor surfaces 13 and 15. Fifty-six 28-mil diameter thermal vias 17 were evenly applied in an area of 0.358 in.². A rigid epoxy board 11 was used in preference to a flexible film. The rigid epoxy board having a thickness of 27-mil. A single adhesive layer 25 of 4-mil thickness, and a dielectric layer 21 of 0.7-mil thick solder resist material were used to attach the circuit to a 100-mil thick aluminum 6061 substrate 27. The aluminum substrate 27 had an aluminum oxide layer (not shown) applied per a prior art method (MIL-A-8625E, Type II, Class 2, Color:Black), that was approximately 0.5-mil thick. The thermal resistance of this prior art laminate was measured at 2.14° C/W. This measurement was from the upper copper layer 13 to a point directly on the opposite side, on the exterior surface of the aluminum substrate 27. A destructive dielectric strength test method using a 50 µA current sensitivity recorded an 800 VDC breakdown strength in an ambient environment of 125° C. This measurement was taken from the upper copper conductor 13 to the aluminum substrate 27.

EXAMPLE 3

A multilayer wiring board laminate 10 using the cross-section construction shown in FIG. 4 was fabricated. A 2.7-mil (2 Oz/ft²) copper thickness was used on copper conductor surfaces 13 and 15. Twenty 28-mil diameter thermal vias 17 were evenly applied in an area of 0.358 in.². The flexible circuit layer 11 was 2-mil thick. The combined aluminum oxide layer 31 and 35 was 4-mil thick. A (Sn95Ag5) solder layer 18 approximately 3-mil thick was applied per the preferred embodiment. A 1-mil thick copper deposition layer 22 was applied by a CVD process. The aluminum substrate 27 was 6061 aluminum 100-mil thick. The thermal resistance of this laminate of the subject invention was measured at 0.76° C/W. This measurement was from the upper copper layer 13 to a point directly on the opposite side, on the exterior surface of the aluminum substrate 27. A destructive dielectric strength test method using a 50 µA current sensitivity recorded a 1,450 VDC breakdown strength in an ambient environment of 125° C. This measurement was taken from the upper copper conductor 13 to the aluminum substrate 27. Surprisingly, retesting indicated that the dielectric strength had not been reduced and remained at 1,450 VDC. The underlying mechanism for this occurrence is not yet understood, but is thought to be attributable to re-anodization of pockets of pure aluminum between aluminum anodize primary oxide layer 31 and aluminum anodize secondary oxide layer 35 that were not fully anodized during the secondary anodization process. This re-anodization may be caused by the high voltage applied across the laminate and unrinsed electrolyte remaining in the sealed pores.

The present invention has been described with reference to preferred embodiments. Other modifications and alterations will occur to those skilled in the art upon reading and understanding the specification. It is intended that all modifications and alterations be included insofar as they come within the scope of the appended claims or equivalents thereof.

SUMMARY, RAMIFICATIONS, AND SCOPE

Accordingly the reader will see that the dielectric substrate laminate and the method of producing a multilayer wiring board laminate with enhanced thermal dissipation can be used to increase the heat transfer, dielectric strength, and bond strength of any device which may be mounted thereto.

Although the description above contains many specifications, these should not be construed as limiting the scope of the invention, but merely as providing illustrations of some of the presently preferred embodiments of this invention.

For example, the aluminum substrate may be replaced with another valve metal substrate such as niobium, tantalum, titanium, tungsten, zirconium, vanadium, or magnesium and anodized per the appropriate methods. As explained previously, U.S. patent application Ser. No.

07/674,820 teaches the use of metal-matrix composite substrates for this use.

In leu of a two-step anodized aluminum oxide layer, the aluminum oxide layers may be formed by a vapor deposition process; the preferred two-layer dielectric of aluminum oxide may be replaced with other dielectrics such as diamond, aluminum nitride, beryllium oxide, a single monolayer, etc; each dielectric layer may use different materials to modify the nature of the invention, such as a thin layer of diamond deposited on a thin layer of aluminum oxide formed on the aluminum substrate thereby reducing the large differential CTE of the aluminum substrate and the diamond layers.

The preferred vapor deposition method of solderable layer precipitation may be replaced or augmented by an autocatalytic process such as taught in U.S. patent application Ser. No. 07/674,820, an electroplating process, sputtering, etc.

Using the specific methods taught in U.S. patent application Ser. No. 07/674,820, the metallic substrate may be a polymer such as polyetheretherketone in a clamshell-like configuration. The polymer should be capable of sustaining a temperature of 240° C. for a short period, about 10 seconds. The substrate may be constructed in two halves, wherein an internal network of fluid passages may transfer heat to a remote location. The fluid passages may be replaced by, or augmented by, a highly thermally conductive structural member, such as an aluminum ladder-shaped structure. The two halves of the substrate may be sealed by an electromagnetic process. Pure aluminum or an aluminum alloy may be precipitated on to the surface of the substrate by a vapor deposition process and anodized per a prior art method. Another layer of aluminum may be precipitated on to the newly-formed aluminum oxide surface by a vapor deposition method and anodized by a prior art method. The solderable layer may be autocatalytically plated, or if a thick coating is desired, electroformed, on to specific areas of the exterior, and possibly the interior surfaces of the substrate. A solder material may then be precipitated on to specified areas of the substrate by normal electroplating methods. A multilayer circuit may then be adhered to the so-constructed cold plate laminate by a thermal-pressing operations whereby a pressure of about 7,000 kg/m$^2$ is applied at a temperature of 240° C. for a period of about 10 seconds to areas of the structure that require the high heat transfer, dielectric strength and bonding properties of the present invention.

Thus the scope of the invention should be determined by the appended claims and their legal equivalents, rather than by the examples given.

I claim:

1. A multilayer wiring board device, comprising:
   an aluminum metallic substrate;
   an aluminum anodize primary oxide layer adjacent the aluminum metallic substrate;
   an aluminum anodize secondary oxide layer adjacent the aluminum anodize primary oxide layer;
   a substantially copper deposition layer adjacent the aluminum anodize secondary oxide layer;
   a solder layer adjacent the copper deposition layer; and
   a multilayer wiring board adjacent the solder layer.

2. The multilayer wiring board device of claim 1 wherein the multilayer wiring board includes a lower conductor layer adjacent the solder layer.

3. The multilayer wiring board device of claim 2 wherein the lower conductor layer is substantially made of copper.

4. The multilayer wiring board device of claim 2 wherein the multilayer wiring board includes a dielectric base material layer adjacent the lower conductor layer.

5. The multilayer wiring board device of claim 4 wherein the multilayer wiring board includes an upper conductor layer adjacent the dielectric base material layer.

6. The multilayer wiring board device of claim 5 wherein the upper conductor layer is substantially made of copper.

7. The multilayer wiring board device of claim 6 wherein the multilayer wiring board includes a solder resist mask adjacent the upper conductor layer.

8. The multilayer wiring board device of claim 7 wherein the multilayer wiring board includes at least one thermal via.

9. The multilayer wiring board device of claim 8 wherein the solder layer comprises tin and silver.

* * * * *